United States Patent
Singh et al.

(10) Patent No.: US 11,711,090 B2
(45) Date of Patent: Jul. 25, 2023

(54) CURRENT STEERING DIGITAL TO ANALOG CONVERTER (DAC) SYSTEM TO PERFORM DAC STATIC LINEARITY CALIBRATION

(71) Applicant: VERVESEMI MICROELECTRONICS PRIVATE LIMITED, Greater Noida (IN)

(72) Inventors: Pratap Narayan Singh, Greater Noida (IN); Adeel Ahmad, Greater Noida (IN); Chinmaya Dash, Greater Noida (IN)

(73) Assignee: VERVESEMI MICROELECTRONICS PRIVATE LIMITED, Greater Noida (IN)

( * ) Notice: Subject to any disclaimer, the term of this patent is extended or adjusted under 35 U.S.C. 154(b) by 0 days.

(21) Appl. No.: 17/105,363

(22) Filed: Nov. 25, 2020

(65) Prior Publication Data

US 2021/0159907 A1   May 27, 2021

(30) Foreign Application Priority Data

Nov. 27, 2019   (IN) .............................. 201911048485

(51) Int. Cl.
  *H03M 1/10*   (2006.01)
  *H03M 1/06*   (2006.01)
  *H03M 1/68*   (2006.01)
  *H03M 1/74*   (2006.01)

(52) U.S. Cl.
  CPC ....... *H03M 1/1033* (2013.01); *H03M 1/0604* (2013.01); *H03M 1/1047* (2013.01); *H03M 1/68* (2013.01); *H03M 1/742* (2013.01)

(58) Field of Classification Search
  CPC .. H03M 1/1033; H03M 1/0604; H03M 1/742; H03M 1/68; H03M 1/1047
  USPC .................................................. 341/118, 144
  See application file for complete search history.

(56) References Cited

U.S. PATENT DOCUMENTS

| | | |
|---|---|---|
| 6,489,905 B1 | 12/2002 | Lee et al. |
| 6,897,794 B2 | 5/2005 | Kuyel et al. |
| 8,089,380 B2 | 1/2012 | McLachlan et al. |
| 8,125,361 B2 | 2/2012 | Choe et al. |
| 9,379,728 B1 * | 6/2016 | Singh .................. H03M 1/1023 |
| 9,548,752 B1 | 1/2017 | Shrivastava et al. |

(Continued)

FOREIGN PATENT DOCUMENTS

| | | |
|---|---|---|
| CN | 102075188 A | 5/2011 |
| CN | 104333382 A | 2/2015 |

OTHER PUBLICATIONS

Huang et al., "A 10-bit Nanoampere Level Current-Steering Digital to Analog Converter" 13th International Symposium on Communications and Information Technologies, 2013.

*Primary Examiner* — Khai M Nguyen
(74) *Attorney, Agent, or Firm* — Maschoff Brennan

(57) ABSTRACT

In accordance with the present invention a system and method for calibration of the current steering DAC is elaborated which helps to reduce design complexity and reduce silicon area required in the design. Present invention is utilising a clocked comparator and plurality of switch transistors 405,305 and AUX DAC in conjunction with digital estimator and digital compensator blocks to estimate the errors in the current sources 406 and compensate the errors using same AUX DAC during normal operation mode.

5 Claims, 3 Drawing Sheets

*Segmented DAC Calibration Scheme*

(56) References Cited

U.S. PATENT DOCUMENTS

| | | | |
|---|---|---|---|
| 10,587,280 B2 * | 3/2020 | Chen | ........................ H03M 1/68 |
| 2005/0001747 A1 | 1/2005 | Kuyel et al. | |
| 2011/0037630 A1 | 2/2011 | McLachlan et al. | |
| 2012/0007757 A1 | 1/2012 | Choe et al. | |
| 2017/0041014 A1 | 2/2017 | Shrivastava et al. | |

\* cited by examiner

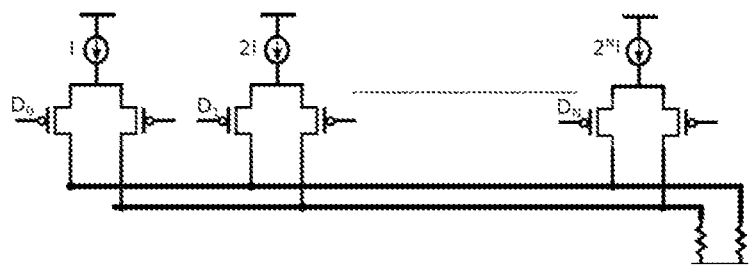
FIG 1: Current Steering Prior Art
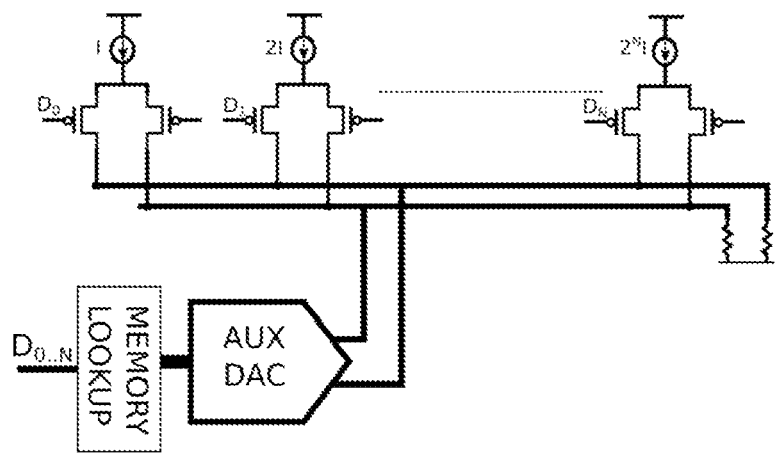
FIG 2: Prior Art Calibrated DAC using Memory based lookup

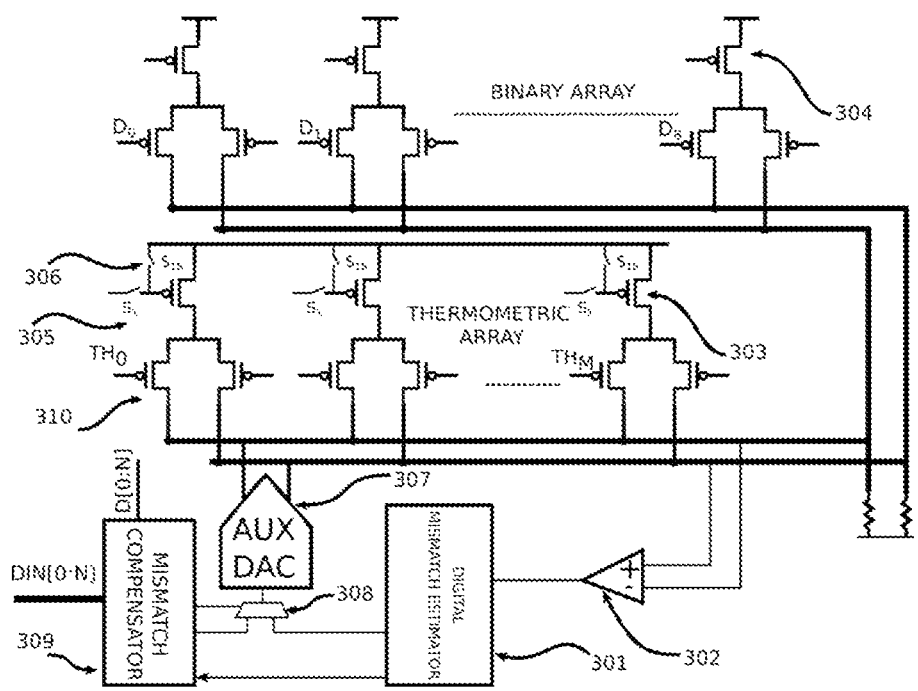
FIG 3: Segmented DAC Calibration Scheme

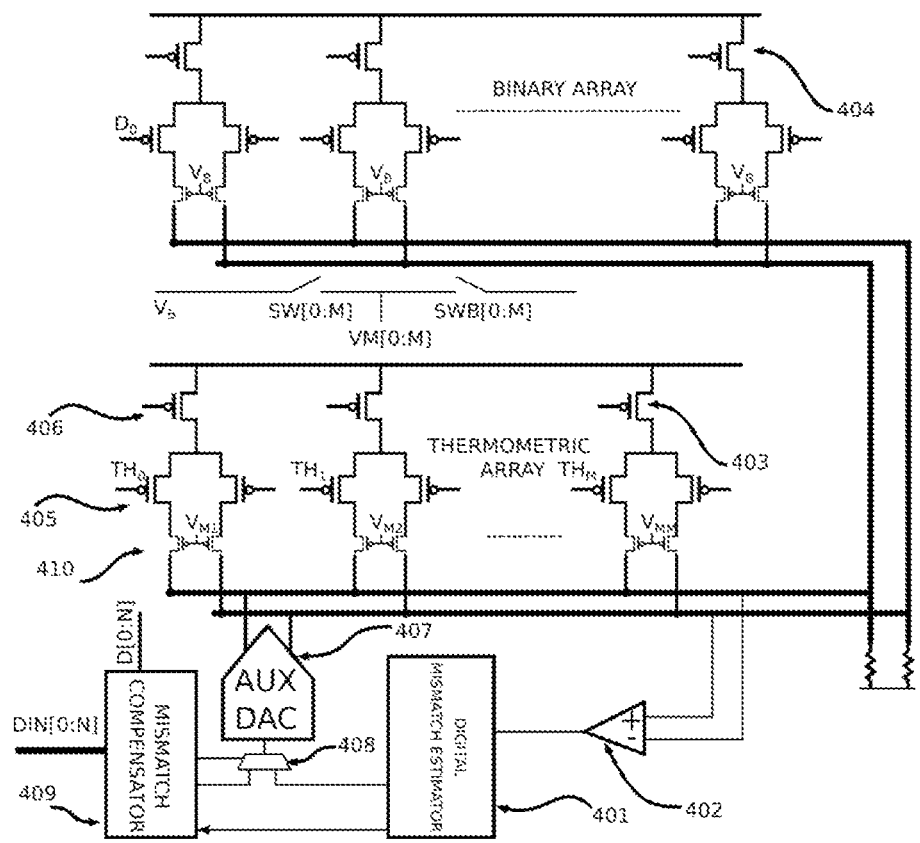
FIG 4: Segment Switching without Current Source Switching

CURRENT STEERING DIGITAL TO ANALOG CONVERTER (DAC) SYSTEM TO PERFORM DAC STATIC LINEARITY CALIBRATION

FIELD OF INVENTION

Present invention relates to the field of digital to analog conversion (DAC) and in particular to the current source static linearity error calibration of the said digital to analog converter.

BACKGROUND OF INVENTION

High precision and high-resolution digital to analog converters requiring high speed operation are mostly current steering type and accuracy is mostly driven by the ratio metric matching of the current sources used to represent the input digital code by weighted sum of these current sources. If higher resolution is needed for the application, then matching of the current sources becomes the limiting factor for the performance. FIG. 1 is representing a binary weighted current steering DAC which converters digital word D[0:N] into the analog output voltage resulted from binary weighted sum of all currents flowing into the output resistance. As shown in FIG. 2, some of the relevant prior arts known to the inventors include:

U.S. Pat. No. 6,897,794 that have used the method of measuring the value of the currents during production test and storing the measured mismatch data in to lookup memory and applying it during normal application as error voltage. This can improve the accuracy of the current sources and hence accuracy of the DAC. But this method is more expensive in terms of production time and requires large silicon area because of the on-chip memory. U.S. Pat. No. 6,489,905 discloses using one current source as reference and changing the values of the current sources by adjusting the gate voltage of the MOS of all used current sources to ensure matching the reference current source. This method requires plurality of switches connecting to the gate of the sources and it increases the complexity of the design. U.S. Pat. No. 9,548,752 advocates using a fixed reference current source and two sub DAC setup to estimate the error of the current sources and change the gate voltage of the source transistor to achieve desired current value. This method requires plurality of the sub DACs to correct error of each primary current source. Which again is at the cost of silicon area and power.

U.S. Pat. No. 8,125,361 relates to techniques for automatically calibrating the current switch elements of the DACs. System that measures and corrects the mismatch of the current source switch elements at the output node of the DAC using average voltages of the two sources and estimating the error using an R2R DAC but this method can only calibrate equal current sources and will not be able to calibrate binary and thermometric combination.

U.S. Pat. No. 8,089,380 discloses a scheme where error measurement is done on tester and then applied using a look up table to correct the errors but this method has impact on production time.

OBJECTIVES OF INVENTION

Principal object of this invention is to provide a method to perform DAC static linearity calibration. In other word the main objective is to calibrate static linearity of the segmented current steering DACs using minimal analog hardware feedback loop.

Another objective of the present invention is to achieve the improved linearity of the DAC without impacting the area and power of the digital to analog converter. Yet another objective of the present invention is to reduce design complexity and also reduce silicon area required in the design.

SUMMARY OF THE INVENTION

The invention discloses a method to perform DAC static linearity calibration wherein the current steering digital to analog converter (DAC) circuit comprising: plurality of current sources arranged in binary or thermometric and binary combination controlled by switching elements adding all currents to analog outputs, said analog outputs are further coupled with a comparator and said comparator outputs are used to detect error in said current sources values by a digital mismatch estimator by controlling the current sources and input of a calibration DAC to generate an output which is less than or greater than zero depending upon the error is current source error under estimation, estimated errors are used by a digital mismatch compensator controlling the said calibration DAC based on input data to minimise the error in output.

In one of the embodiments of the (DAC) circuit, the feedback comparator further comprises any high gain device which is able to detect a difference and current switching method is decided in a way to have no impact from the offset of the said feedback comparator.

In other embodiment the DAC circuit further comprises as a DAC with more voltage range than the current source under calibration including the said feedback comparator offset error to be able to produce the zero crossing at the input of the comparator removing need for any reference voltage source during the calibration process.

In yet other embodiment, the mismatch estimator further comprises as a controller to switch and control the calibration DAC as well as the said current sources in the sequence to generate the differential zero crossing at the comparator input, aid calibration DAC inputs are further used to generate mismatch error Information In still another embodiment the digital mismatch compensator further comprises a circuit to receive the mismatch error information from the said mismatch estimator and use this information along with digital input data to generate a digital code to cancel the error in DAC output by application of said code to input of the calibration DAC In yet another embodiment the said circuit further involved a delay block for simultaneous application of the calculated error data and DAC input signal

DESCRIPTION OF FIGURES

FIG. 1 Current Steering Prior Art
FIG. 2 Prior Art Calibrated DAC using Memory based lookup
FIG. 3 Segmented DAC in Estimation Phase
FIG. 4 Segment Switching without Current Source Switching

DETAILED DESCRIPTION OF INVENTION

In accordance with the present invention a system and method for calibration of the current steering DAC is elaborated which helps to reduce design complexity and reduce silicon area required in the design. Present invention is utilising a clocked comparator and plurality of switch transistors 405,305 and AUX DAC in conjunction with digital estimator and digital compensator blocks to estimate the errors in the current sources 406 and compensate the errors using same AUX DAC during normal operation mode.

During calibration period, DIGITAL MISMATCH ESTIMATOR 301,401 drives the main DAC inputs D[0:B] and TH[0:M]. The differential voltage that appears due to this input to main DAC is compensated by the AUX DAC through successive approximation. The AUX DAC starts with middle code, provides clock edge to the analog comparator 302,402, then depending on the value of comparator output the next code for AUX DAC is decided. The AUX DAC has finer steps to correctly capture even small differential outputs. The Mismatch Estimator drives multiple values to the DAC and captures corresponding AUX DAC code which compensates the differential output. The inputs to main DAC are driven in a manner such that each current source can be isolated from others and errors due to each current source can be estimated. The error in current source is either added or subtracted in final differential output of the current steering DAC depending on the value of digital input to it. Hence the mismatch compensator circuit 309,409 uses incoming digital value and appropriately adds or subtracts error for each current source to drive to the AUX DAC during normal DAC operations. The latency needed for calculating AUX DAC input is balanced by adding pipelines to Main DAC input path. The Clock frequency of calibration period can be independent of normal frequency of DAC operation.

For the example combination of B+1 binary and M+1 Thermometric DAC, one of the estimator schemes is given below. One of the Thermometric current sources is treated as a reference current source. In case of no mismatch, each Thermometric current source will drive the same current, and if LSB of Binary current sources is added to sum all binary current sources, that will also match the same current. Errors of all thermometric sources compared to reference current source are measured and captured. While two Thermometric current sources are being compared, all other Thermometric current sources are disconnected using switch embodiments 305 and 306 and 410. Redundant calculations using multiple paths for same errors can be done to improve the error accuracy at the cost of calibration time. The binary current sources are also measured referenced to the Thermometric current source. In this case, a differential voltage is already expected as individual binary current sources are smaller in magnitude than the thermometric current source. The error is the difference from expected differential value. For all binary current sources, differences are calculated. The sum of all differences is averaged over B+2 current sources to get unit reference current. This reference current is weighed correctly as per position of binary current source and subtracted from the obtained difference to estimate error in the binary sources. Object 408,308 is used to select between calibration mode and operation mode application of the AUX DAC 407,307. Where when DAC is in normal operation mode the error values are applied using same DAC to compensate the errors. This helps in reducing the dependency with supply and temperature change.

While the invention has been particularly described with references to preferred embodiments thereof, it will be understood by those skilled in the art that various changes may be made therein without departing from the scope of the invention encompassed by the appended claims.

We claim:

1. A current steering digital to analog converter (DAC) comprising:
    a plurality of current sources arranged in binary or thermometric and binary combination controlled by switching elements adding all currents;
    an analog comparator coupled to DAC analog outputs from a calibration DAC, the DAC analog outputs configured to detect error in the currents;
    a digital mismatch estimator coupled with an output from the analog comparator and configured to control the plurality of current sources and input of the calibration DAC;
    the calibration DAC coupled to the plurality of current sources and configured to generate an output which is less than or greater than zero depending upon an error in a current source of the plurality of current sources under estimation;
    a multiplier used to select a mode of operation of the calibration DAC; and
    a digital mismatch compensator configured to control the calibration DAC based on input data to minimize the error in the output.

2. The current steering digital to analog converter (DAC) as claimed in in claim 1, wherein the analog comparator further comprises any high gain device which is able to detect a voltage difference between input terminals of the analog comparator.

3. The current steering digital to analog converter (DAC) as claimed in claim 1, wherein the calibration DAC is configured to generate a voltage range that is greater than a combination of a voltage range of the current source under estimation and an offset error from the analog comparator such that the calibration DAC produces a zero crossing at an input of the analog comparator, removing need for any reference voltage source.

4. The current steering digital to analog converter (DAC) as claimed in claim 1, wherein the digital mismatch estimator further comprises a controller to switch and control the calibration DAC and the plurality of current sources to generate a differential zero crossing at an input of the analog comparator, the input of the calibration DAC is further used to generate mismatch error information.

5. The current steering digital to analog converter (DAC) as claimed in claim 1, wherein the digital mismatch compensator further comprises a circuit to receive mismatch error information from said the digital mismatch estimator and use the mismatch error information along with digital input data to generate a digital code to cancel the error in the DAC analog outputs by application of said code to input into the calibration DAC.

* * * * *